United States Patent
Kosugi

(10) Patent No.: US 11,682,916 B2
(45) Date of Patent: Jun. 20, 2023

(54) PROCESSING DEVICE, PROCESSING METHOD, AND NON-TRANSITORY STORAGE MEDIUM

(71) Applicant: InsuRTAP Inc., Tokyo (JP)

(72) Inventor: Shinichiro Kosugi, Tokyo (JP)

(73) Assignee: InsuRTAP Inc., Tokyo (JP)

( * ) Notice: Subject to any disclaimer, the term of this patent is extended or adjusted under 35 U.S.C. 154(b) by 0 days.

(21) Appl. No.: 17/794,131

(22) PCT Filed: Mar. 9, 2020

(86) PCT No.: PCT/JP2020/009988
§ 371 (c)(1),
(2) Date: Jul. 20, 2022

(87) PCT Pub. No.: WO2021/181453
PCT Pub. Date: Sep. 16, 2021

(65) Prior Publication Data
US 2023/0094652 A1 Mar. 30, 2023

(51) Int. Cl.
*H02J 7/00* (2006.01)
*G01R 31/367* (2019.01)
*G01R 31/392* (2019.01)

(52) U.S. Cl.
CPC ............ *H02J 7/005* (2020.01); *G01R 31/367* (2019.01); *G01R 31/392* (2019.01); *H02J 7/0048* (2020.01)

(58) Field of Classification Search
CPC ...... H02J 7/005; H02J 7/0048; G01R 31/392; G01R 31/367
(Continued)

(56) References Cited

U.S. PATENT DOCUMENTS 10,403,936 B2 9/2019 Kobayashi et al.
2016/0226268 A1* 8/2016 Okui ............... H02J 7/0071
(Continued)

FOREIGN PATENT DOCUMENTS

JP 2014-082120 A 5/2014
JP 2016-163400 A 9/2016
(Continued)

OTHER PUBLICATIONS

Toru Ezawa, et al., "Battery Performance Prediction Technology for Electric Vehicles", Toshiba Review, [online] 2014, [Search on Feb. 13, 2020], pp. 49-52, vol. 69, No. 2.
(Continued)

*Primary Examiner* — Nathaniel R Pelton
(74) *Attorney, Agent, or Firm* — Sughrue Mion, PLLC

(57) ABSTRACT

The present invention provides a battery control system (10) including a storage unit (11) that stores a lower limit of an SOH secured on a target date in a plurality of battery systems, a deterioration rate calculation unit (12) that calculates a deterioration rate indicated by a reduced amount of the SOH per unit cumulative charge amount [Wh] or unit cumulative discharge amount [Wh] for each battery system, an SOH specifying unit (13) that specifies the SOH at a reference timing in each of the battery systems, a state calculation unit (14) that calculates a cumulative charge amount or a cumulative discharge amount that is available from the reference timing to the target date under a condition that the SOH on the target date reaches the lower limit of the SOH, based on the target date, the lower limit of the SOH, the deterioration rate, and the SOH at the reference timing, for each battery system, a priority determination unit (15) that determines a priority of charging/discharging for the plurality of battery systems based on a calculation result obtained by the state calculation unit (14), and a
(Continued)

charging/discharging control unit (16) that controls the charging/discharging of the plurality of battery systems based on the priority of the charging/discharging.

10 Claims, 9 Drawing Sheets

(58) Field of Classification Search
USPC .......................................................... 320/132
See application file for complete search history.

(56) References Cited

U.S. PATENT DOCUMENTS

2018/0269541 A1\* 9/2018 Kobayashi ................ H02J 3/32
2021/0379999 A1\* 12/2021 Yang .................... G07C 5/0816

FOREIGN PATENT DOCUMENTS

| | | |
|---|---|---|
| JP | 2017-212843 A | 11/2017 |
| JP | 2018-191500 A | 11/2018 |
| WO | 2016/114147 A1 | 7/2016 |

OTHER PUBLICATIONS

International Search Report for PCT/JP2020/009988 dated Jun. 9, 2020 [PCT/ISA/210].

\* cited by examiner

11,682,916 B2

PROCESSING DEVICE, PROCESSING METHOD, AND NON-TRANSITORY STORAGE MEDIUM

CROSS REFERENCE TO RELATED APPLICATIONS

This application is a National Stage of International Application No. PCT/JP2020/009988 filed Mar. 9, 2020.

TECHNICAL FIELD

The present invention relates to a processing device, a processing method, and a program.

BACKGROUND ART

Patent Document 1 discloses a technique for controlling a battery system or a power generation device held by an electric power consumer. Non-Patent Document 1 discloses a technique for predicting the future performance of a battery.

RELATED DOCUMENT

Patent Document

[Patent Document 1] Japanese Laid-open Patent Publication No. 2017-212843

Non-Patent Document

[Non-Patent Document 1] Toru EZAWA and the other one, "Battery Performance Prediction Technology for Electric Vehicles", [online], Toshiba Review Vol. 69 No. 2 (2014), [Search on Feb. 13, 2020], Internet <URL: https://www-.toshiba.co.jp/tech/review/2014/02/69_02pdf/f03.pdf>

SUMMARY OF THE INVENTION

Technical Problem

In recent years, battery systems have become widespread. There are also owners who own a plurality of battery systems, and control and use the battery systems in an integrated manner.

As a method of controlling and using a plurality of battery systems in an integrated manner, a method of using a plurality of battery systems in the same manner can be considered. That is, a plurality of battery systems are charged/discharged by the same power amount [Wh]. In this case, as shown in FIG. 1, the usage miles (cumulative charged/discharged power amount [Wh]) of the plurality of battery systems increase in the same manner.

However, in a method of using a plurality of battery systems in the same manner, the following problems occur.

As a premise, the deterioration rates of the plurality of battery systems vary. The deterioration rate varies depending on differences in manufacturers, model numbers, manufacturing times, lots, installation environments, and the like. For example, even though such a condition is completely satisfied, the deterioration rate may vary based on an individual difference. When a plurality of battery systems are used in the same manner regardless of the possibility of such a difference in deterioration rate, the deterioration degrees of the plurality of battery systems vary, and the degree of variation increases year by year, as shown in FIG. 1. In FIG. 1, the deterioration degree is indicated by the value of the state of health (SOH).

In consideration of safety, it is not possible to use a battery system that has reached a level of deterioration (safe use limit level). When the deterioration rates of a plurality of battery systems vary as in the example of FIG. 1, some battery systems have reached a safe use limit level (in the case of FIG. 1, the safe use limit SOH defined by the manufacturer) earlier than other battery systems, and become unusable.

As described above, in a plurality of battery systems owned by the owner, when some battery systems deteriorate more than other battery systems and become unusable, the power [W] and the power amount [Wh] that can be charged/discharged by all the plurality of battery systems are reduced. As a result, the commercial value of all the plurality of battery systems owned by the owner is decreased.

An object of the present invention is to provide a technique for suppressing a decrease in commercial value of all a plurality of battery systems which are controlled and used in an integrated manner.

Solution to Problem

According to the present invention, there is provided a battery control system including a storage unit that stores a lower limit of a state of health (SOH) secured on a target date in a plurality of battery systems, each including a power conditioning system (PCS), a battery management system (BMS), and a battery, a deterioration rate calculation unit that calculates a deterioration rate indicated by a reduced amount of the SOH per unit cumulative charge amount [Wh] or unit cumulative discharge amount [Wh] for each battery system, an SOH specifying unit that specifies the SOH at a reference timing in each of the battery systems, a state calculation unit that calculates a cumulative charge amount or a cumulative discharge amount which is available from the reference timing to the target date under a condition that the SOH on the target date reaches the lower limit of the SOH, based on the target date, the lower limit of the SOH, the deterioration rate, and the SOH at the reference timing, for each battery system, a priority determination unit that determines a priority of charging/discharging for the plurality of battery systems based on a calculation result obtained by the state calculation unit, and a charging/discharging control unit that controls the charging/discharging of the plurality of battery systems based on the priority of the charging/discharging.

Further, according to the present invention, there is provided a battery control method including, by a computer, storing a lower limit of an SOH secured on a target date in a plurality of battery systems, each including a PCS, a BMS, and a battery, calculating a deterioration rate indicated by a reduced amount of the SOH per unit cumulative charge amount [Wh] or unit cumulative discharge amount [Wh] for each battery system, specifying the SOH at a reference timing in each of the battery systems, calculating a cumulative charge amount or a cumulative discharge amount which is available from the reference timing to the target date under a condition that the SOH on the target date reaches the lower limit of the SOH, based on the target date, the lower limit of the SOH, the deterioration rate, and the SOH at the reference timing, for each battery system, determining a priority of charging/discharging for the plurality of battery systems based on a result of the calculation, and controlling the charging/discharging of the plurality of battery systems based on the priority of the charging/discharging.

Further, according to the present invention, there is provided a program causing a computer to function as a storage unit that stores a lower limit of an SOH secured on a target date in a plurality of battery systems, each including a PCS, a BMS, and a battery, a deterioration rate calculation unit that calculates a deterioration rate indicated by a reduced amount of the SOH per unit cumulative charge amount [Wh] or unit cumulative discharge amount [Wh] for each battery system, an SOH specifying unit that specifies the SOH at a reference timing in each of the battery systems, a state calculation unit that calculates a cumulative charge amount or a cumulative discharge amount which is available from the reference timing to the target date under a condition that the SOH on the target date reaches the lower limit of the SOH, based on the target date, the lower limit of the SOH, the deterioration rate, and the SOH at the reference timing, for each battery system, a priority determination unit that determines a priority of charging/discharging for the plurality of battery systems based on a calculation result obtained by the state calculation unit, and a charging/discharging control unit that controls the charging/discharging of the plurality of battery systems based on the priority of the charging/discharging.

Advantageous Effects of Invention

According to the present invention, a technique for suppressing a decrease in commercial value of all a plurality of battery systems which are controlled and used in an integrated manner is realized.

DESCRIPTION OF EMBODIMENTS

First Embodiment

"Outline"

A battery control system according to the present embodiment calculates a deterioration rate of each of a plurality of battery systems that are controlled and used in an integrated manner. The battery control system determines a priority of charging/discharging for the plurality of battery systems based on the calculated deterioration rate, and controls the charging/discharging of the plurality of battery systems based on the priorities.

Figure 1:
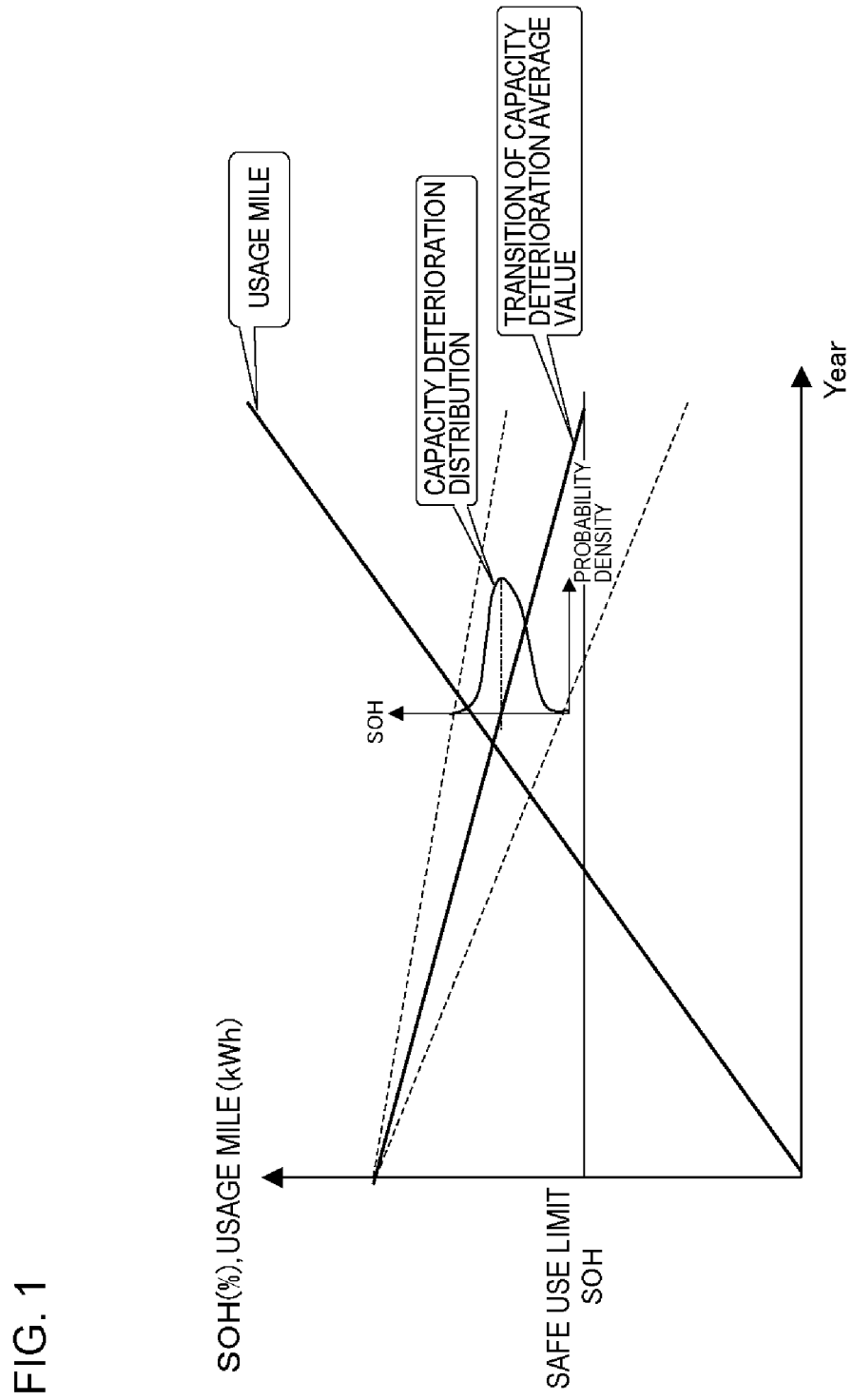
FIG. 1 is a diagram for explaining processing of a comparative example.
Figure 2:
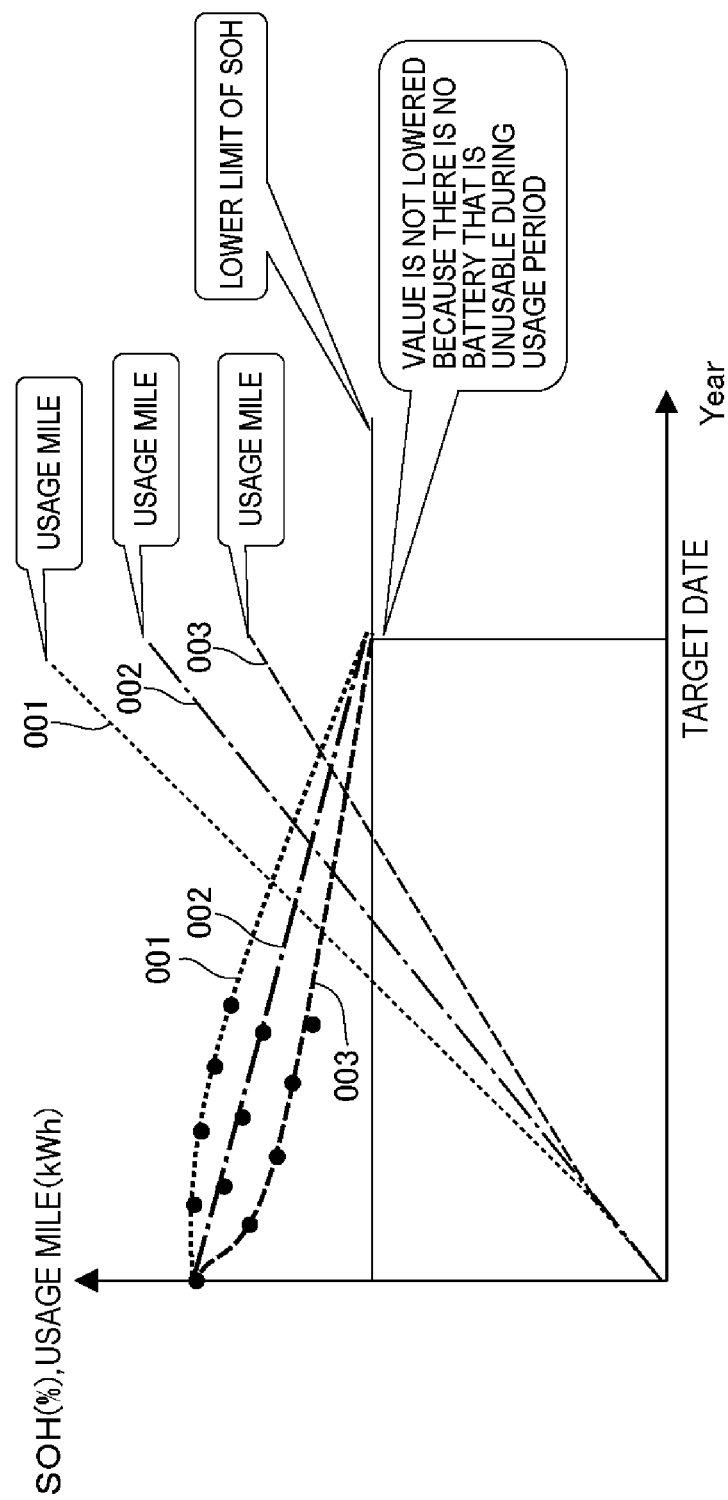
FIG. 2 is a diagram for explaining an advantageous effect of the present embodiment.

As shown in FIG. 2, a form of change of the usage miles (cumulative charged/discharged power amount [Wh]) of the plurality of battery systems controlled by such a battery control system may differ from each other. Specifically, a battery system with a high priority has an increase rate of the cumulative charged/discharged power amount (usage miles), which is higher than an increase rate of a battery system with a low priority.

In the case of the example shown in FIG. 2, there are a battery system of 001, a battery system of 002, and a battery system of 003 in ascending order of the deterioration rate of the SOH. In this case, the battery control system assigns the highest priority to the battery system of 001, assigns the next highest priority to the battery system of 002, and assigns the lowest priority to the battery system of 003. As a result, the battery system of 001, the battery system of 002, and the battery system of 003 are obtained in descending order of the increase rate of the usage miles.

As a result of such control, the variation in the deterioration degree (SOH) of the plurality of battery systems is reduced. Thus, the inconvenience that some of the plurality of battery systems reach the safe use limit level (lower limit of the SOH in the case of FIG. 2) earlier than the other battery systems, and become unusable is suppressed.

"Overall Image of Processing System"

Figure 3:
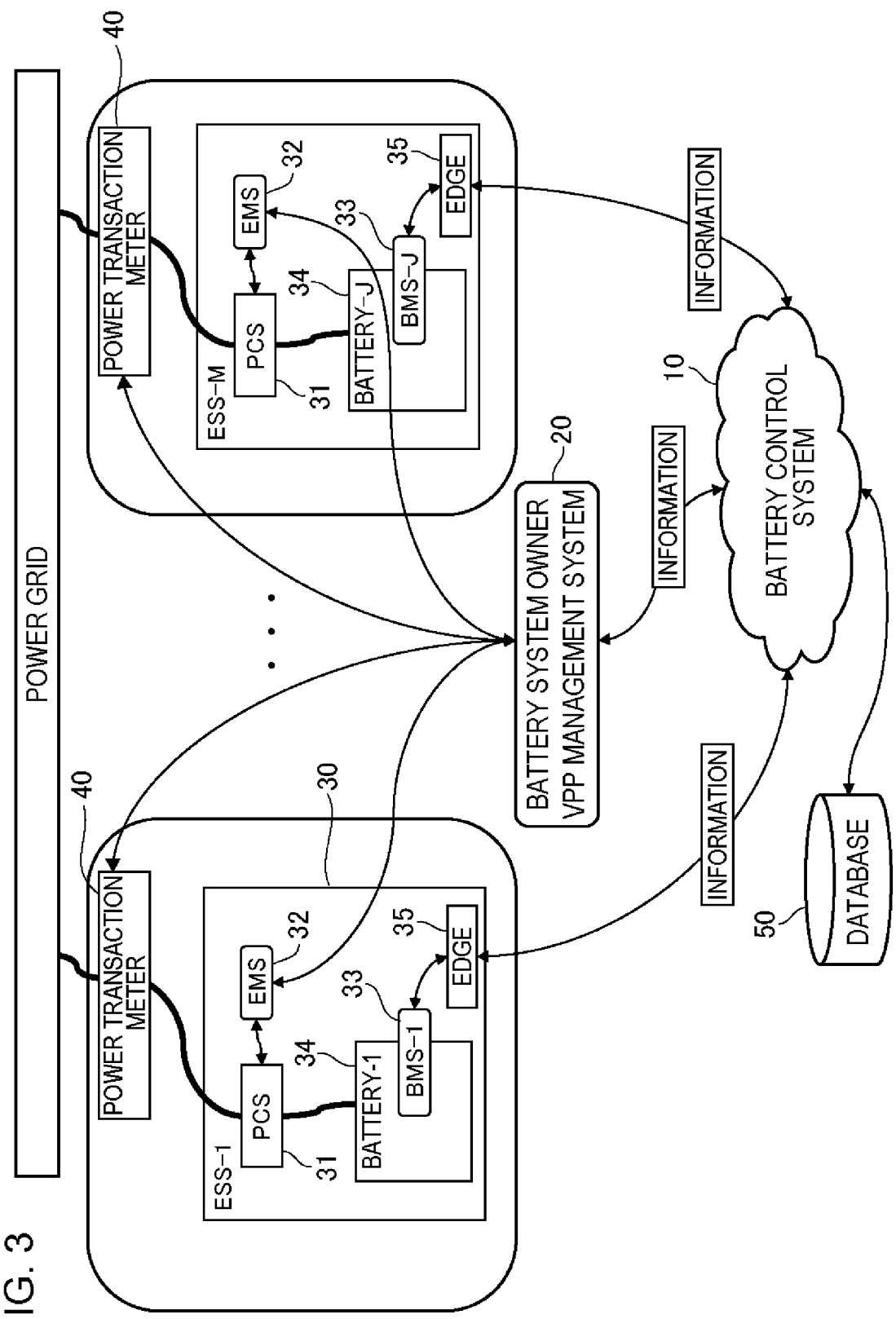
FIG. 3 is a diagram for explaining an overall image of a processing system in the present embodiment.

The overall image of a processing system including a battery control system 10 will be described with reference to FIG. 3.

Each of a plurality of battery systems 30 that are controlled and used in an integrated manner includes a PCS 31, an energy management system (EMS) 32, a BMS 33, a battery 34, and an edge 35.

The PCS 31 performs conversion between DC power and AC power. The battery 34 stores electric power. The battery 34 is configured to include, for example, a cell stack for storing energy, and a battery monitor for monitoring a cell temperature, a cell voltage, and the like. The battery 34 is a secondary battery that can repeat charging/discharging, and the type of battery is not particularly limited. The BMS 33 monitors the state of the battery 34. The edge 35 acquires various types of measurement data (temperature, current, state of charge (SOC), and the like) regarding the battery 34 and transmits the acquired data to the battery control system 10. The EMS 32 uses an information communication technique to grasp the usage status of electric power in an electric power consumer and control the charging/discharging of the battery 34.

A power transaction meter 40 performs various measurements and transmits the measurement results to a VPP management system 20. For example, the power transaction meter 40 measures the charged power [W], the discharged power [W], the cumulative charged power amount [Wh], the cumulative discharged power amount [Wh], and the like of the battery system 30.

The VPP management system 20 is a system managed by the owner of the plurality of battery systems 30. The VPP management system 20 performs processing of, for example, acquiring information from the plurality of battery systems 30, the power transaction meter 40, and the like, and transmitting the information to the battery control system 10.

The battery control system 10 calculates the deterioration rate in each of the plurality of battery systems 30 based on pieces of information acquired from the plurality of battery systems 30 and the VPP management system 20. The battery control system 10 determines a priority of charging/discharging for the plurality of battery systems 30 based on the calculated deterioration rate, and controls the charging/discharging of the plurality of battery systems based on the priorities. The control content may be transmitted from the battery control system 10 to each battery system 30, or may be transmitted from the battery control system 10 to each battery system 30 through the VPP management system 20.

A database 50 stores various types of information regarding the plurality of battery systems 30.

Here, a modification example of the overall image of the processing system will be described. In the above example, the battery control system 10 receives some pieces of information necessary for processing from the edge 35 in the battery system 30, and receives the rest of information from the VPP management system 20. In the modification example, the battery control system 10 may receive information from the edge 35 through the VPP management system 20.

"Configuration of Battery Control System 10"

Next, a configuration of the battery control system 10 will be described in detail. First, an example of a hardware configuration of the battery control system 10 will be described. Each functional unit included in the battery control system 10 is realized by any combination of hardware and software mainly including a central processing unit (CPU), a memory, a program loaded onto the memory, a storage unit such as a hard disk that stores the above program, and an interface for a network connection, in any computer. The above storage unit can store a program downloaded from a storage medium such as a compact disc (CD), or a server and the like on the Internet in addition to a program stored, in advance, at a state of shipping the device. It is understood by those skilled in the art that there are various modification examples in a method and device of realizing the functional unit.

Figure 4:
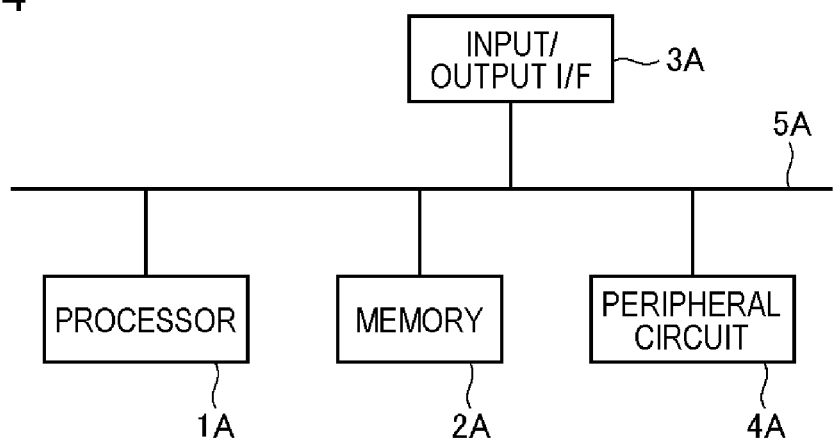
FIG. 4 is a diagram showing an example of a hardware configuration of a battery control system in the present embodiment.

FIG. 4 is a block diagram showing the hardware configuration of the battery control system 10. As shown in FIG. 4, the battery control system 10 includes a processor 1A, a memory 2A, an input/output interface 3A, a peripheral circuit 4A, and a bus 5A. The peripheral circuit 4A includes various modules. The battery control system 10 does not have to include the peripheral circuit 4A. The battery control system 10 may be configured by a plurality of physically and/or logically separated devices, or may be configured by one physically and/or logically integrated device. When the battery control system 10 is configured by a plurality of physically and/or logically separated devices, each of the plurality of devices can have the above hardware configuration.

The bus 5A is a data transmission path used when the processor 1A, the memory 2A, the peripheral circuit 4A, and the input/output interface 3A transmit and receive data to each other. The processor 1A is, for example, an arithmetic operation processing device such as a CPU or a graphics processing unit (GPU). The memory 2A is, for example, a memory such as a random access memory (RAM) or a read only memory (ROM). The input/output interface 3A includes, for example, an interface for acquiring information from an input device, an external device, an external server, an external sensor, a camera, and the like, and an interface for outputting information to an output device, an external device, an external server, and the like. The input device is, for example, a keyboard, a mouse, a microphone, a physical button, or a touch panel. The output device is, for example, a display, a speaker, a printer, or a mailer. The processor 1A can issue a command to each module and perform an arithmetic operation based on the arithmetic operation result thereof.

Figure 5:
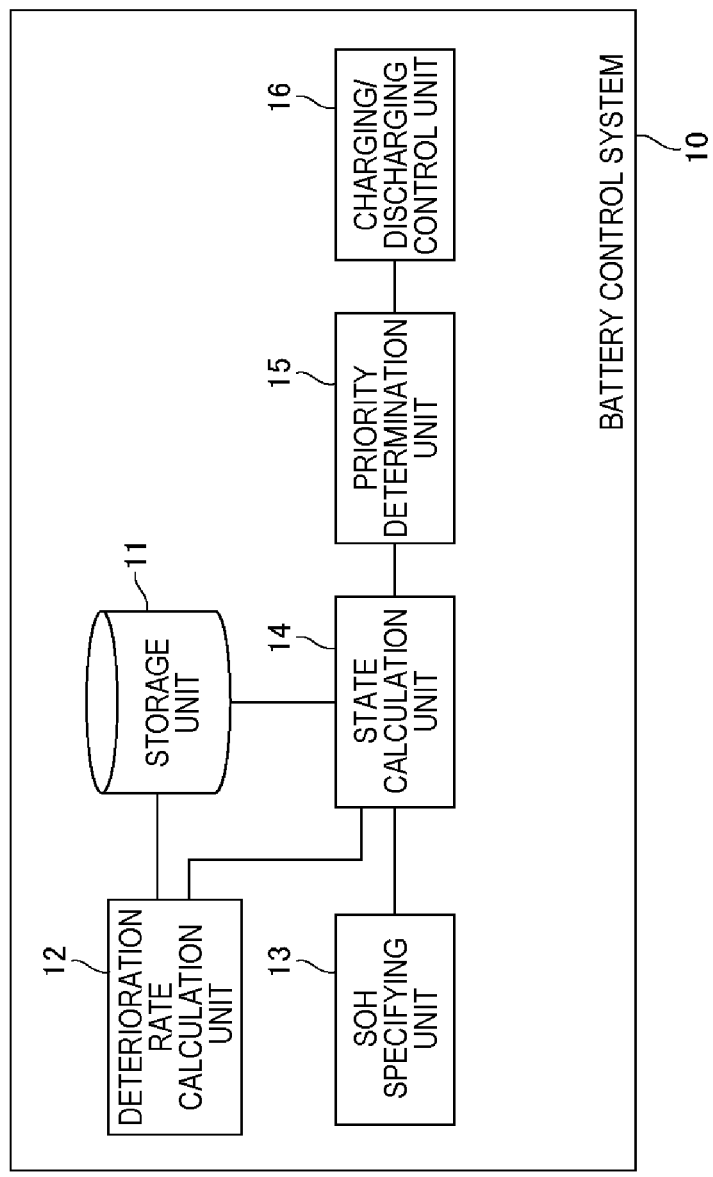
FIG. 5 is a functional block diagram showing an example of the battery control system in the present embodiment.
Figure 6:
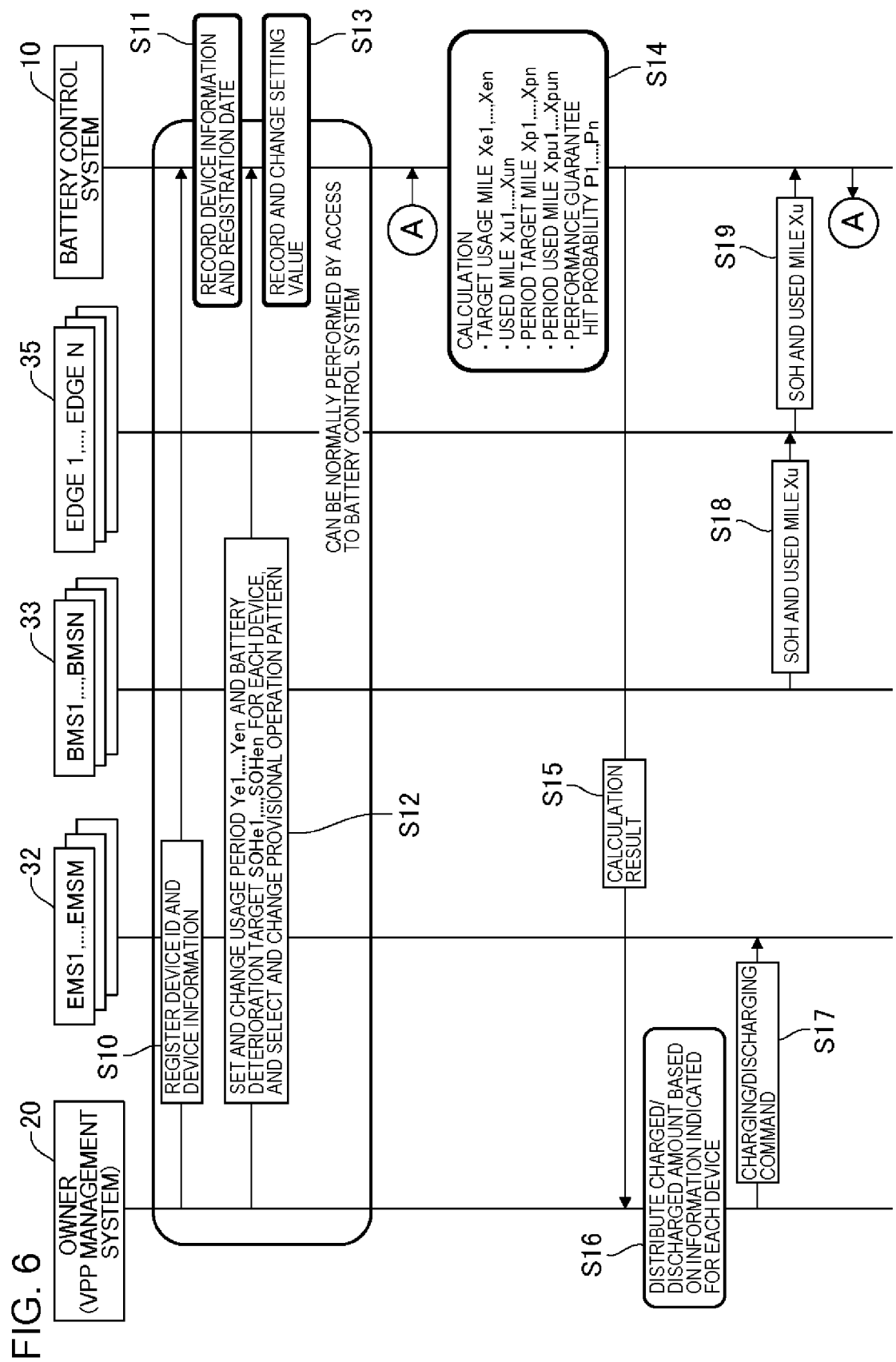
FIG. 6 is a sequence diagram showing an example of a processing flow of the processing system in the present embodiment.

Next, a functional configuration of the battery control system 10 will be described. FIG. 5 shows an example of the functional block diagram of the battery control system 10. As shown in FIG. 5, the battery control system 10 includes a storage unit 11, a deterioration rate calculation unit 12, an SOH specifying unit 13, a state calculation unit 14, a priority determination unit 15, and a charging/discharging control unit 16. A processing flow of the battery control system 10 and a functional configuration of each functional unit will be described below with reference to the sequence diagram of FIG. 6.

First, the owner of the plurality of battery systems 30 operates the VPP management system 20 to register battery system information of each of the plurality of battery systems 30 in the battery control system 10. In response to the operation, the VPP management system 20 transmits the battery system information to the battery control system 10 (S10). The battery control system 10 stores the received battery system information in the storage unit 11 (S11).

The owner may operate other communication devices such as a smartphone, a portable phone, a tablet terminal, and a personal computer to perform processing of registering the battery system information of each of the plurality of battery systems 30 in the battery control system 10.

The battery system information registered here is information that may have an influence on the deterioration rate of the battery system 30. Examples of the battery system information include the manufacturer, the model number, the manufacturing time, the lot, the installation environment, the battery material, and performance information (battery energy capacity, rated output, and the like), and lifespan performance information of the battery system 30. Such battery system information is not limited to the above examples.

The owner operates the VPP management system 20 to input and register the target date, the lower limit of the SOH secured on the target date, and an operation pattern of the battery system 30 for each battery system 30. In response to the operation, the VPP management system 20 transmits the information to the battery control system 10 (S12). The battery control system 10 stores the received information in the storage unit 11 (S13).

The target date and the lower limit of the SOH are freely determined by the owner. The operation pattern indicates a manner of charging/discharging the battery system 30. For example, a plurality of operation patterns may be prepared in advance, and the owner may select one of the operation patterns. The following contents are exemplified as the operation pattern, but the operation pattern is not limited to the following contents.

<Operation Pattern 1>

The electric power generated by sunlight is charged in the daytime and discharged at night. Charging/discharging is performed once a day.

<Operation Pattern 2>

Charging/discharging is performed for the purpose of adjusting the frequency of a power grid. Typically, the charging/discharging is repeated in an SOC range (example: 20% to 80%) in which the battery has the highest durability.

<Operation Pattern 3>

Charging/discharging is performed for the purpose of cutting the peak power of an electric power consumer. In this case, discharging is performed during the daytime when the power consumption of the electric power consumer is high, and charging is performed at another time. Typically, the charging/discharging is repeated in the SOC range (example: 20% to 80%) in which the battery has the highest durability.

Then, the deterioration rate calculation unit 12 performs various calculations for each battery system 30 (S14). An example of the calculation performed by the deterioration rate calculation unit 12 will be described below.

<Calculation of Deterioration Rate>

For example, the deterioration rate calculation unit 12 calculates the deterioration rate [%/Wh] indicated by the reduced amount of the SOH per unit cumulative charge amount [Wh] or unit cumulative discharge amount [Wh] for each battery system 30. That is, the deterioration rate indicates the reduced amount of the SOH when the battery system 30 performs charging or discharging by the unit cumulative charge amount [Wh] or the unit cumulative discharge amount [Wh].

Although will be described below, the deterioration rate calculation unit 12 can calculate the deterioration rate based on the measured values of the SOH at a plurality of previous measurement timings and the measured value of the cumulative charge amount or the cumulative discharge amount. Immediately after the registration of S10 to S13, the amount of data (measured value) is not enough for calculating the deterioration rate.

Therefore, until data having an amount enough for calculating the deterioration rate is obtained (example: about two years), the deterioration rate calculation unit 12 estimates the deterioration rate of each battery system 30 by using information specific to each battery system 30, such as the manufacturer, the model number, the manufacturing time, the lot, the installation environment, the battery material, and performance information (battery energy capacity, rated output, and the like), and lifespan performance information of the battery system 30. For example, an arithmetic operation expression or an estimation model (result of machine learning) in which the deterioration rate is calculated by inputting the values of the above parameters may be prepared in advance. The deterioration rate calculation unit 12 may estimate the deterioration rate for each battery system 30 based on the prepared arithmetic operation expression or estimation model. In this case, the deterioration rates of the battery systems 30 in which the values of the above parameters completely match have the same values.

<Calculation of Cumulative Charge Amount or Cumulative Discharge Amount (Target Usage Mile) that is Available From Reference Timing to Target Date>

The state calculation unit 14 calculates the cumulative charge amount or the cumulative discharge amount that is available from the reference timing to the target date under a condition that the SOH on the target date reaches the lower limit of the SOH, based on the target date, the lower limit of the SOH, the deterioration rate, and the SOH at the reference timing, for each battery system 30.

The "cumulative charge amount or cumulative discharge amount that is available from the reference timing to the target date" means the cumulative value of the power amount that can be charged to the battery system 30 from the reference timing to the target date, or the cumulative value of the power amount that can be discharged from the battery system 30 from the reference timing to the target date.

The SOH specifying unit 13 specifies the SOH at the reference timing. The reference timing is a timing at which the calculation process of S14 is executed. The SOH specifying unit 13 acquires information indicating the SOH at a timing at which the calculation process of S14 is executed or the neighboring timing, from each of the plurality of battery systems 30. Since the method by which the battery system 30 measures the SOH is a well-known technique, the description thereof will not be repeated here.

The state calculation unit 14 calculates the cumulative charge amount or the cumulative discharge amount that is available from the reference timing to the target date, in a manner that a difference obtained by subtracting the lower limit of the SOH from the SOH at the reference timing is divided by the deterioration rate. For example, when the SOH at the reference timing is 95%, the lower limit of the SOH is 70%, and the deterioration rate is X [%/Wh], the cumulative charge amount or the cumulative discharge amount that is available from the reference timing to the target date is 25/X [Wh]. The cumulative charge amount and the cumulative discharge amount basically have the same value.

<Calculation of Cumulative Charge Amount or Cumulative Discharge Amount (Period Target Mile) that is Available within Predetermined Target Period>

The state calculation unit 14 calculates the cumulative charge amount or the cumulative discharge amount that is available within a predetermined target period, in a manner that the cumulative charge amount or the cumulative discharge amount that is available from the reference timing to the target date is proportionally divided at a ratio proportional to the number of days within the predetermined target period and the number of days from the reference timing to the target date, for each battery system 30.

First, a period from the reference timing to the target date is divided into a plurality of sub-periods. For example, one year from January 1st to December 31st may be set as one sub-period, and the period from the reference timing to the target date may be divided into a plurality of sub-periods in units of one year. A manner of dividing the sub-period described here is an example, and is not limited to this example. For example, the period from the reference timing to the target date may be divided into a plurality of sub-periods in units of one month or one week.

The state calculation unit 14 calculates the cumulative charge amount or the cumulative discharge amount that is available within each target period, by using, as the target period, each of the plurality of sub-periods included in the period from the reference timing to the target date.

For example, when the reference timing is Jan. 1, 2020, the target date is Dec. 31, 2024, and the cumulative charge amount or cumulative discharge amount that is available from the reference timing to the target date is M [Wh], the cumulative charge amount or cumulative discharge amount that is available within each target period (each sub-period) is N/5 [Wh].

<Calculation of Remaining Cumulative Charge Amount or Cumulative Discharge Amount that is Available within Predetermined Target Period (Period Target Mile–Period Used Mile)>

The state calculation unit 14 calculates the remaining cumulative charge amount or cumulative discharge amount that is available within the predetermined target period, in a manner that the cumulative charge amount or the cumulative discharge amount used within the predetermined target period is subtracted from the cumulative charge amount or the cumulative discharge amount that is available within the predetermined target period, for each battery system 30.

The "cumulative charge amount or cumulative discharge amount used within the predetermined target period" means the cumulative value of the power amount actually charged within the predetermined target period or the cumulative value of the power amount actually discharged within the predetermined target period.

<Determination of Priority of Charging/Discharging>

The priority determination unit 15 determines the priority of charging/discharging for the plurality of battery systems 30 based on the calculation result by the state calculation unit 14.

For example, the priority determination unit 15 may determine higher priorities in order from the battery system 30 having the largest remaining cumulative charge amount or cumulative discharge amount that is available within the predetermined target period. In this case, the "predetermined target period" is a target period including a time point for determining the priority. When the priority is determined in this manner, the battery system 30 having a larger remaining cumulative charge amount or cumulative discharge amount that is available within a predetermined target period is preferentially charged/discharged.

In addition, the priority determination unit 15 determines a priority higher than the priority of a group of the battery systems 30 in which the remaining cumulative charge amount or cumulative discharge amount that is available within the predetermined target period is less than a reference value, for a group of the battery systems 30 in which the remaining cumulative charge amount or cumulative discharge amount that is available within the predetermined target period is equal to or more than the reference value. The priority determination unit 15 may determine higher priorities for a plurality of battery systems 30 included in each group of the battery system 30 in ascending order of the deterioration rate. The "predetermined target period" in this case is also a target period including the time point for determining the priority.

In addition, the priority determination unit 15 may determine the priority of charging/discharging for the plurality of battery systems 30 in descending order of the cumulative charge amount or the cumulative discharge amount that is available from the reference timing to the target date. In this case, the battery system 30 having a larger cumulative charge amount or cumulative discharge amount that is available from the reference timing to the target date is preferentially charged/discharged.

In addition, the priority determination unit 15 may determine the priority higher than the priority of the group of the battery systems 30 in which the cumulative charge amount or the cumulative discharge amount that is available from the reference timing to the target date is less than the reference value, for the group of the battery systems 30 in which the cumulative charge amount or the cumulative discharge amount that is available from the reference timing to the target date is equal to or more than the reference value. The priority determination unit 15 may determine higher priorities for a plurality of battery systems 30 included in each group of the battery system 30 in ascending order of the deterioration rate.

Returning to FIG. 6, the battery control system 10 transmits at least some of the calculation results of S14 to the VPP management system 20 (S15). The VPP management system 20 distributes the power amount to be charged/discharged, to the plurality of battery systems 30 based on the information received in S15 (S16), and transmits a charging/discharging command indicating the distribution result to the EMS 32 (S17).

That is, the VPP management system 20 first acquires information indicating the power amount [Wh] to be charged or discharged by the plurality of battery systems 30. A unit that acquires the information is not particularly limited. The VPP management system 20 distributes the power amount [Wh] to be charged or discharged, to the plurality of battery systems 30 based on the information received in S15.

The VPP management system 20 may perform the distribution so that the battery system 30 having a relatively high priority charges/discharges a larger power amount [Wh] than the battery system 30 having a relatively low priority.

The VPP management system 20 may distribute the upper limit of the power amount that can be charged/discharged by each battery system 30 as the power amount charged/discharged from each battery system 30, in order from the battery system 30 having a relatively high priority.

The VPP management system 20 does not have to cause the battery system 30 in which the remaining cumulative charge amount or the remaining cumulative discharge amount that is available within the predetermined target period does not remain (0 or less), to perform charging/discharging. That is, the VPP management system 20 does not have to distribute the power amount to be charged/discharged, to such a battery system 30.

The VPP management system 20 does not have to cause the battery system 30 in which the cumulative charge amount or the cumulative discharge amount that is available from the reference timing to the target date is 0 (the SOH at the reference timing has reached the lower limit of the SOH), to perform charging/discharging. That is, the VPP management system 20 does not have to distribute the power amount to be charged/discharged, to such a battery system 30.

The EMS 32 controls the charging/discharging of the battery 34 based on the command from the VPP management system 20. The BMS 33 monitors the state of the battery 34 and transmits measured values of the SOH, the cumulative charged/discharged amount, the battery temperature, the current value, the SOC, and the like to the battery control system 10 through the edge 35 (S18 and S19). The measurement timing of the SOH and the timing of transmitting the measurement data from the BMS 33 to the battery control system 10 are design matters.

An acquisition method of the SOH and the like is not limited to the acquisition from the BMS 33. When the BMS 33 does not output the SOH, another device such as the battery control system 10 can also calculate the SOH by using the history of the cell voltage, current, and temperature data obtained by measurement of the BMS 33. The premise is similar in all of the following embodiments.

The battery control system 10 stores the received measurement data in the storage unit 11. The battery control system 10 can manage the cumulative charged/discharged amount (Wh) from the start of use, the cumulative charged/discharged amount (Wh) within the predetermined target period, and the like for each battery system 30, based on the information received in S18 and S19. The battery control system 10 may manage the cumulative charged/discharged amount (Wh) within the predetermined target period (sub-period) by resetting the cumulative charged/discharged amount (Wh) every time the predetermined target period (sub-period) is ended.

Then, the battery control system 10 repeats the processes of S14 to S19. That is, various calculations in S14 are repeated, and the priority of charging/discharging is updated as needed based on the latest state at any time.

When the measurement data is accumulated in the storage unit 11, the deterioration rate calculation unit 12 calculates the deterioration rate of each battery system 30 based on the measured values of the SOH at a plurality of previous measurement timings of each battery system 30 and the measured value of the cumulative charge amount or the cumulative discharge amount.

For example, the deterioration rate calculation unit 12 calculates the deterioration rate based on the reduced amount of the SOH in a period from a certain measurement timing to the next measurement timing, and the changed amount of the cumulative charge amount or the cumulative discharge amount in that period. That is, the deterioration rate calculation unit 12 calculates the deterioration rate between the two measurement timings before and after in time. The deterioration rate calculation unit 12 may calculate a statistical value such as the average value, the maximum value, the minimum value, the mode value, and the median value of the calculation result, as the deterioration rate of the battery system 30. Alternatively, the deterioration rate calculation unit 12 may calculate the deterioration rate between two latest measurement timings, as the deterioration rate of the battery system 30. The deterioration rate calculation unit 12 may calculate the standard deviation of the above calculation result.

The state calculation unit 14 calculates, based on the deterioration rate of the battery system 30 calculated in this manner, the cumulative charge amount or the cumulative discharge amount that is available from the reference timing to the target date, the cumulative charge amount or the cumulative discharge amount that is available within the predetermined target period, the remaining cumulative charge amount or cumulative discharge amount that is available within the predetermined target period, the priority of charging/discharging, and the like.

A timing at which a method of calculating the deterioration rate is switched to a method of calculating the deterioration rate based on the previous measurement data of each battery system 30 may be, for example, a timing at which the value of the standard deviation becomes equal to or less than a threshold value, a timing at which the cumulative charge amount or the cumulative discharge amount becomes equal to or more than the threshold value. As the above timing, a timing at which the measurement data at the measurement timing for the number of times equal to or more than the threshold value is stored in the storage unit 11, a timing at which the elapsed time from a start timing of using the battery system 30 exceeds a threshold value, and other timings may be used. With such a timing, it is possible to switch the method of calculating the deterioration rate at a timing at which pieces of measurement data allowing calculation of sufficiently high reliability are collected.

The VPP management system 20 may output at least some of the calculation results received in S15 through an output device such as a display. The VPP management system 20 may receive an input to change the priorities of charging/discharging of the plurality of battery systems 30. When such an input is received, the owner of the plurality of battery systems 30 can grasp the situation of the plurality of battery systems 30 and determine the priorities of charging/discharging of the plurality of battery systems 30 by himself/herself. The VPP management system 20 transmits the received change content of the priority to the battery control system 10. The VPP management system 20 controls the charging/discharging of the plurality of battery systems 30 based on the changed priority.

"Advantageous Effects"

As described above, according to the battery control system 10 in the present embodiment, it is possible to calculate the deterioration rate of each of the plurality of battery systems 30 that are controlled and used in an integrated manner, determine the priority of charging/discharging for the plurality of battery systems 30 based on the calculated deterioration rate, and control the charging/discharging of the plurality of battery systems 30 based on the priorities.

With such control, charging/discharging of the battery system 30 having a relatively slow deterioration rate is accelerated, and the charging/discharging of the battery system 30 having a relatively fast deterioration rate is suppressed. As a result, it is possible to suppress the inconvenience that some battery systems 30 deteriorate faster than other battery systems 30. Thus, the inconvenience that some of the plurality of battery systems reach the safe use limit level earlier than the other battery systems, and become unusable is suppressed.

Further, with such control, it is possible to suppress the appearance of the battery system 30 in which the SOH on the target date is less than the preset lower limit of the SOH.

In the case of the control, the deterioration of the available capacity [Wh] in all the plurality of battery systems 30 follows the average deterioration curve, so that it is possible to perform the business operation as planned.

Further, according to the battery control system 10, the owner can grasp the state of each of the plurality of battery systems 30 based on various values, so that it is possible to make an appropriate usage plan. For example, the owner can easily examine the business operations such as aiming for profits by selecting a group in which the target usage mile (cumulative charge amount or cumulative discharge amount that is available from the reference timing to the target date) is large, and setting a deterioration target (lower limit of the SOH) to be high.

Further, since various values are calculated for each battery system 30 and provided to the owner, the owner can grasp the state of each of the plurality of battery systems 30 based on the values and set an appropriate priority.

Second Embodiment

A manufacturer guarantee is assigned to a battery system 30 in the present embodiment. Specifically, when the SOH becomes less than the manufacturer-guaranteed value before a manufacturer guarantee expiration date, in principle, the manufacturer provides a service for recovering the SOH, such as replacing the battery 34. The exception is, for example, a case where the method of using the battery system 30 does not satisfy the condition.

The battery system 30 that has received the manufacturer guarantee recovers the SOH, and the commercial value of this battery system is increased. From the viewpoint of suppressing a decrease in the commercial value in all the plurality of battery systems 30, it is preferable that the battery system 30 that can receive the manufacturer guarantee positively receives the manufacturer guarantee to increase the commercial value.

Thus, in the present embodiment, the battery system 30 having a higher probability that the SOH becomes less than the manufacturer-guaranteed value before the manufacturer guarantee expiration date is preferentially charged/discharged so that the manufacturer guarantee can be obtained. Such a battery system will be described below in detail.

The state calculation unit 14 in the present embodiment calculates a probability that the SOH becomes less than the manufacturer-guaranteed value on the manufacturer guarantee expiration date after the reference timing (may be referred to as "this probability" below), based on the SOH at the reference timing and the deterioration rate calculated at the reference timing.

The manufacturer guarantee expiration date is defined, for example, by the cumulative charged power amount, the cumulative discharged power amount, or the like (example: 10M [Wh]).

Figure 7:
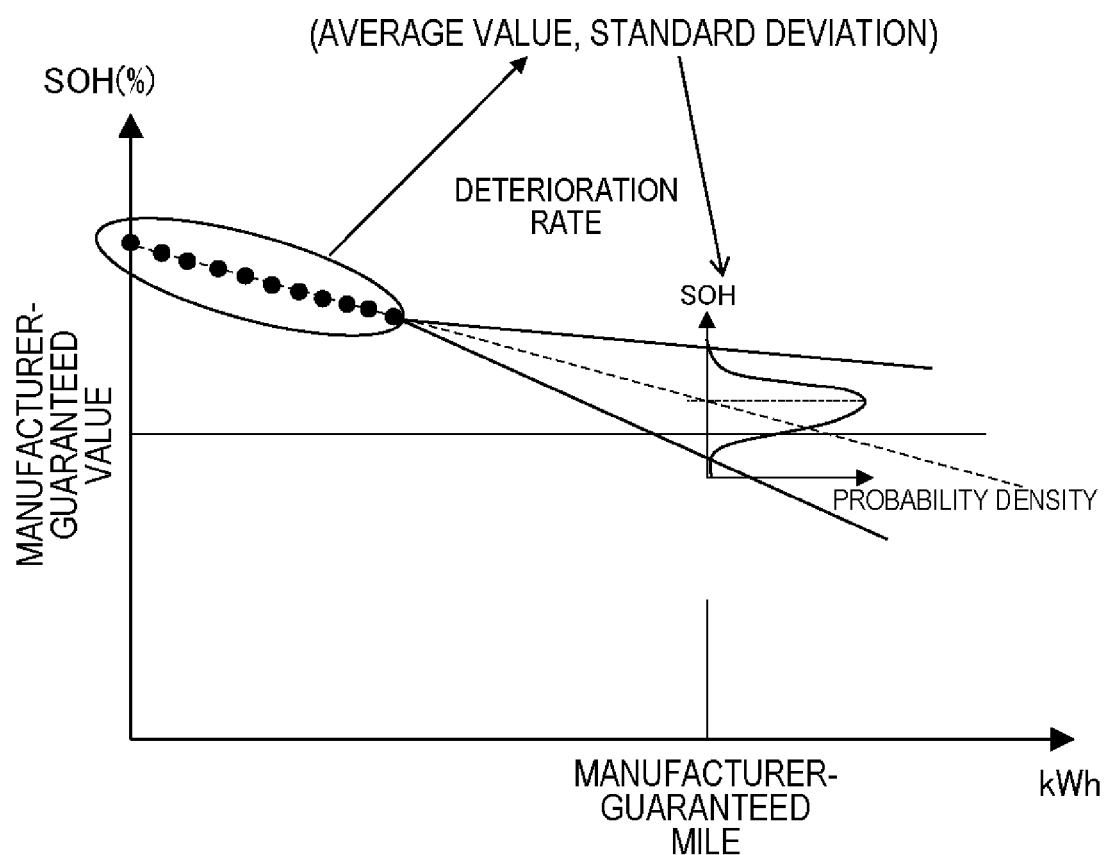
FIG. 7 is a diagram for explaining processing of the battery control system in the present embodiment.

Here, an example of a method of calculating this probability will be described with reference to FIG. 7. For example, the deterioration rate calculation unit 12 calculates the deterioration rate based on the reduced amount of the SOH in a period from a certain measurement timing to the next measurement timing, and the changed amount of the cumulative charge amount or the cumulative discharge amount in that period. That is, the deterioration rate calculation unit 12 calculates the deterioration rate between the two measurement timings before and after in time. The deterioration rate calculation unit 12 calculates the average value and the standard deviation of the calculation result.

The state calculation unit 14 calculates the probability density distribution of the SOH at a timing at which the cumulative charged power amount or cumulative discharged power amount has reached the manufacturer-guaranteed value, based on the SOH at a timing (reference timing) of calculating this probability, and the calculated average value and standard deviation of the deterioration rate. The state calculation unit 14 calculates a probability that the SOH becomes less than the manufacturer-guaranteed value on the manufacturer guarantee expiration date based on the probability density distribution.

In addition, the state calculation unit 14 may calculate the probability that the SOH on the manufacturer guarantee expiration date becomes less than the manufacturer-guaranteed value, in a manner that the existence range of the performance of the battery system 30 at a predetermined timing (manufacturer guarantee expiration date) is expressed in a probability distribution by the method disclosed in Non-Patent Document 1.

The priority determination unit 15 can determine the priorities of charging/discharging of the plurality of battery systems 30 based on this probability.

For example, the priority determination unit 15 may determine a higher priority than the battery system 30 having this probability that is less than the threshold value, for the battery system 30 having this probability that is equal to or higher than the threshold value. When the priority is determined in this manner, the battery system 30 having a higher probability that the SOH becomes less than the manufacturer-guaranteed value until the manufacturer guarantee expiration date is preferentially charged/discharged.

The battery control system 10 may include an output unit that outputs this probability. The output unit transmits this probability to the VPP management system 20. The VPP management system 20 outputs this probability through an output device such as a display. The VPP management system 20 may receive an input to change the priorities of charging/discharging of the plurality of battery systems 30. In this manner, the owner of the plurality of battery systems 30 can determine the priorities of charging/discharging of the plurality of battery systems 30 by himself/herself, based on the probability of each of the plurality of battery systems 30. The VPP management system 20 transmits the received change content of the priority to the battery control system 10. The VPP management system 20 controls the charging/discharging of the plurality of battery systems 30 based on the changed priority.

Other components of the battery control system 10 are similar to those in the first embodiment.

According to the battery control system 10 in the present embodiment described above, the advantageous effects similar to those in the first embodiment are realized. Further, according to the battery control system 10, by preferentially charging/discharging the battery system 30 having a high probability of receiving the manufacturer guarantee, it is possible to guide satisfying of the condition for receiving the manufacturer guarantee. As a result, it is possible to increase the commercial value of the battery system 30 by receiving the manufacturer guarantee.

Third Embodiment

The plurality of battery systems 30 are charged/discharged in accordance with any operation pattern determined by the owner (see the first embodiment), but the owner may change the operation pattern during the operation. When the operation pattern is changed, the deterioration rate of the battery system 30 is also changed. Therefore, it is inappropriate that, after a change of the operation pattern, the various calculations described in the first embodiment are performed by using the deterioration rate itself calculated based on the measurement data collected before the change. The battery control system 10 in the present embodiment includes a unit that improves such inconvenience. The battery control system 10 will be described below in detail.

The deterioration rate calculation unit 12 can calculate the deterioration rate after the change of the operation pattern, with high accuracy, based on "the deterioration degree calculated based on measurement data collected before the change of the operation pattern", "the deterioration degree calculated based on measurement data collected before the change of the operation pattern", and "the deterioration degree before the change of the operation pattern, which has been calculated by a simulation based on various parameters". An example of processing will be described below with reference to the flowcharts of FIGS. 8 and 9.

Figure 8:
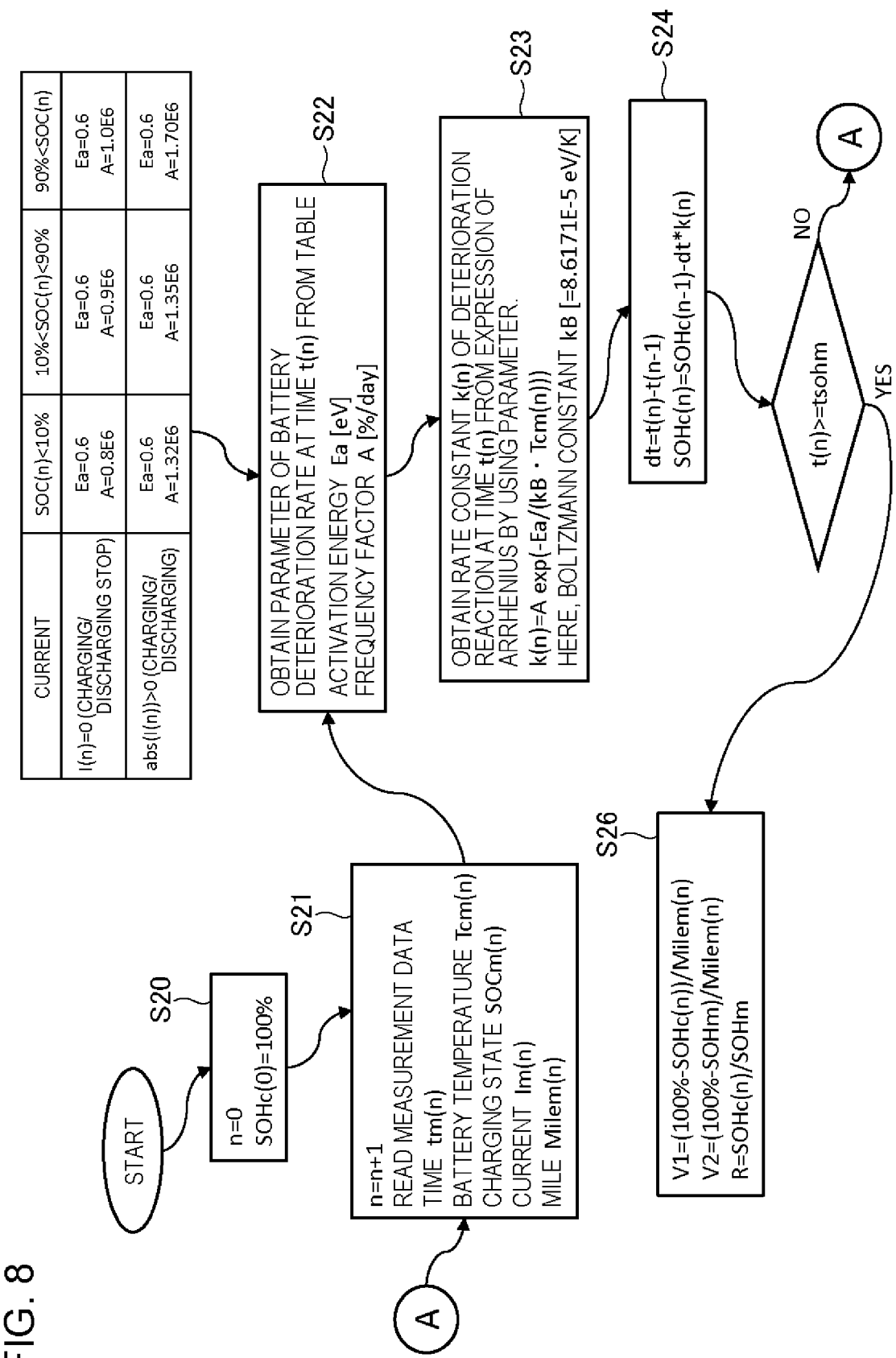
FIG. 8 is a flowchart showing an example of the processing flow of the processing system in the present embodiment.

First, a flow of processing of obtaining a correction coefficient R for correcting the difference between the actual deterioration rate and the deterioration rate calculated by simulation will be described with reference to the flowchart shown in FIG. 8.

S20 to S25 show the flow of processing of calculating the deterioration rate before the change of the operation pattern, by simulation. In S20, the initial value is set. n indicates the measurement timing. n=0 is a timing at which the battery system 30 starts to be used. SOHc(n) indicates the simulation result of the SOH at the measurement timing n. SOHc(0)=100% is defined.

In S21, n is counted up by "1", and the actual measured values of various parameters at this timing are acquired from the measurement data collected before the change of the operation pattern. In S22, the activation energy Ea and the frequency factor A at the measurement timing are obtained based on the parameter values acquired in S21 and the table of the activation energy Ea and the frequency factor A, which has been prepared in advance for each battery system 30. The table shows the relationship between the current, the SOC, the activation energy Ea, and the frequency factor A, but parameters other than the current and the SOC may be used.

In S23, the rate constant k of the deterioration reaction at this timing is obtained based on the activation energy Ea and the frequency factor A obtained in S22 and the values of various parameters acquired in S21.

In S24, SOHc (n) at the measurement timing is obtained based on the rate constant k obtained in S23 and SOHc(n−1) at a measurement timing immediately before the above measurement timing.

If the value of n has not reached the measurement timing at the time of changing the operation pattern (No in S25), the process returns to S21 and the similar processing is repeated. On the other hand, if the value of n has reached the measurement timing at the time of changing the operation pattern (Yes in S25), the process proceeds to S26.

In S26, the correction coefficient R is calculated as a ratio between SOHc(n) being the simulation result of the SOH at the time of changing the operation pattern, which is obtained in the above process, and SOHm being the actual measured value of the SOH at the time of changing the operation pattern. In S26, a deterioration rate V1 can be obtained based on SOHc(n) and the record value (Milem(n)) of the usage mile (cumulative charged/discharged power amount [Wh]) at the time of changing the operation pattern. Further, in S26, a deterioration rate V2 can be obtained based on SOHm and the record value (Milem(n)) of the usage mile (cumulative charged/discharged power amount [Wh]) at the time of changing the operation pattern. The correction coefficient R is a value specific to each battery system 30, and can be set to a fixed value regardless of the operation pattern, the measurement timing, or the like.

Figure 9:
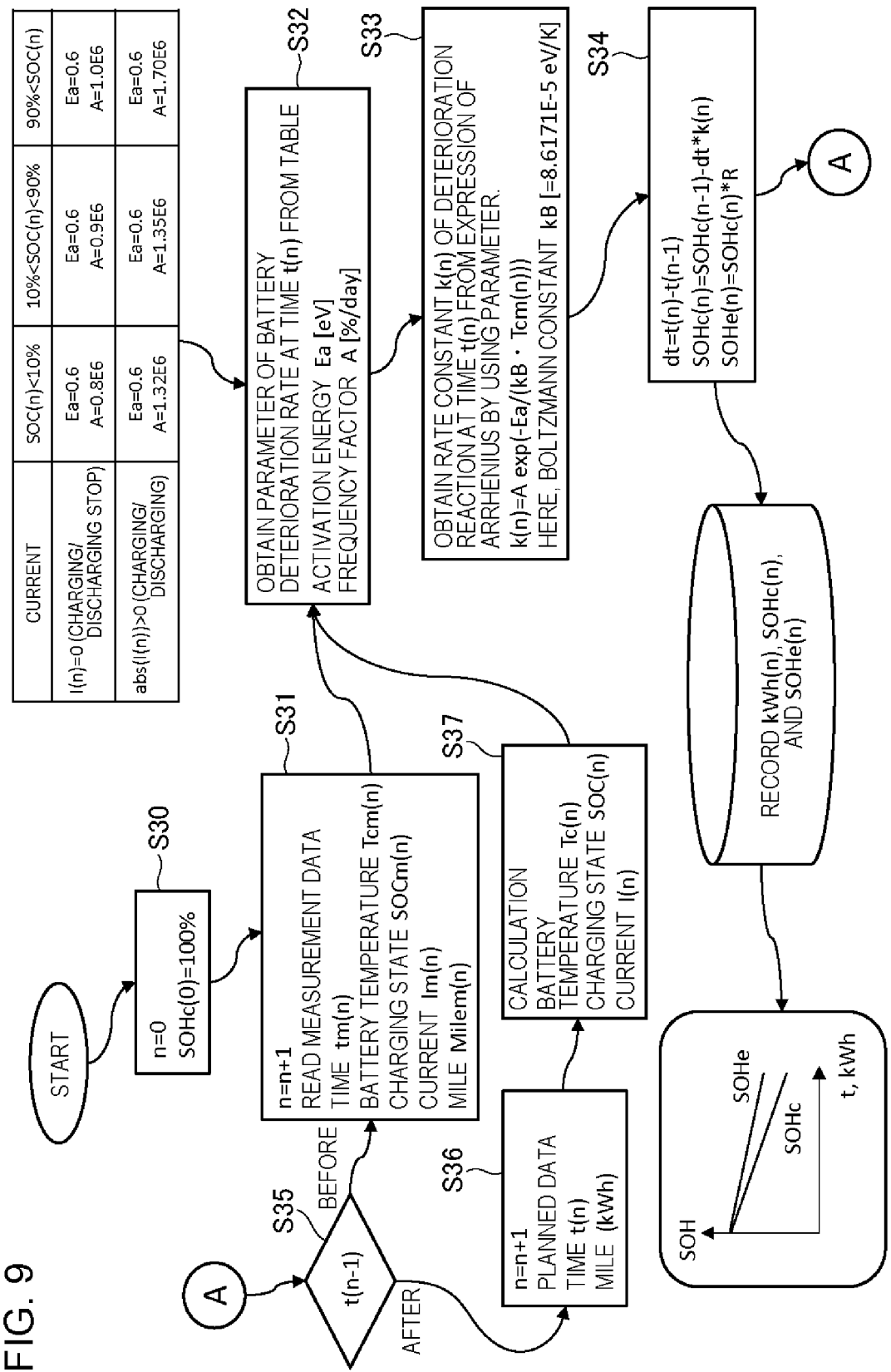
FIG. 9 is a flowchart showing the example of the processing flow of the processing system in the present embodiment.

Next, a flow of processing of obtaining SOHc(n) at each measurement timing before and after the change of the operation pattern change, by simulation based on the correction coefficient R obtained in the processing shown in FIG. 8, will be described with reference to the flowchart shown in FIG. 9.

In S30, the initial value is set. n indicates the measurement timing. n=0 is a timing at which the battery system 30 starts to be used. SOHc(n) indicates the simulation result of the SOH at the measurement timing n. SOHc(0)=100% is defined.

In S31, n is counted up by "1", and the actual measured values of various parameters at this timing are acquired from the measurement data collected before the change of the operation pattern. In S32, the activation energy Ea and the frequency factor A at the measurement timing are obtained based on the parameter values acquired in S31 and the table of the activation energy Ea and the frequency factor A, which has been prepared in advance for each battery system 30. The table shows the relationship between the current, the SOC, the activation energy Ea, and the frequency factor A, but parameters other than the current and the SOC may be used.

In S33, the rate constant k of the deterioration reaction at this timing is obtained based on the activation energy Ea and the frequency factor A obtained in S32 and the values of various parameters acquired in S31.

In S34, SOHc (n) at the measurement timing is obtained based on the rate constant k obtained in S33 and SOHc(n−1) at a measurement timing immediately before the above measurement timing. Obtained SOHc (n) is multiplied by the correction coefficient R to correct the simulation result, and SOHe(n) being the corrected simulation result is obtained. Then, the result is recorded in the database, and the process proceeds to A.

In S35, it is determined whether t(n+1) is before or after the time of changing the operation pattern. When t(n+1) is before the time of changing the operation pattern, the process proceeds to S31 and the similar processing is repeated. On the other hand, when t(n+1) is after the time of changing the operation pattern, the process proceeds to S36.

In S36, n is counted up by "1", and the mile at this timing is predicted based on the changed operation pattern. Then, in S37, the predicted values of the battery temperature, the SOC, the current, and the like at this timing are calculated based on the changed operation pattern.

In S32, the activation energy Ea and the frequency factor A at the measurement timing are obtained based on the parameter values acquired in S37 and the table of the activation energy Ea and the frequency factor A, which has been prepared in advance for each battery system 30. The table shows the relationship between the current, the SOC, the activation energy Ea, and the frequency factor A, but parameters other than the current and the SOC may be used.

In S33, the rate constant k of the deterioration reaction at this timing is obtained based on the activation energy Ea and the frequency factor A obtained in S32 and the values of various parameters acquired in S37 (Tc (n) obtained in S37 is substituted with Tcm(n)).

In S34, SOHc (n) at the measurement timing is obtained based on the rate constant k obtained in S33 and SOHc(n−1) at a measurement timing immediately before the above measurement timing. Obtained SOHc (n) is multiplied by the correction coefficient R to correct the simulation result, and SOHe(n) being the corrected simulation result is obtained. Then, the result is recorded in the database, and the process proceeds to A.

With the above processing, it is possible to obtain and accumulate SOHe(n) while counting up n. It is possible to obtain the deterioration rate of the battery system 30 based on the time-dependent data of SOHe(n). For example, it is possible to obtain the deterioration rate of the battery system 30 after the change of the operation pattern, based on the time-dependent data of SOHe(n) after the change of the operation pattern.

The state calculation unit 14 calculates, based on the deterioration rate of the battery system 30 after the change of the operation pattern, which has been calculated in this manner, the cumulative charge amount or the cumulative discharge amount that is available from the reference timing to the target date, the cumulative charge amount or the cumulative discharge amount that is available within the predetermined target period, the remaining cumulative charge amount or cumulative discharge amount that is available within the predetermined target period, the priority of charging/discharging, and the like.

Other components of the battery control system 10 are similar to those in the first and second embodiments.

According to the battery control system 10 in the present embodiment described above, the advantageous effects similar to those in the first and second embodiments are realized. Further, according to the battery control system 10, even though the operation patterns of the plurality of battery systems 30 change during the operation, it is possible to calculate the deterioration rate of each battery system 30 after the change, with high accuracy, by using the measurement data collected before the change and the like. As a result, even though a situation in which the operation patterns of the plurality of battery systems 30 change during the operation occurs, it is possible to appropriately control the battery systems 30 and appropriately suppress the decrease in the commercial value in all the plurality of battery systems 30.

Modification Examples

Here, a modification example applicable to all the embodiments will be described. In the above embodiments, the SOH is used for calculating the deterioration rate of the battery system 30, but other indexes such as internal resistance may be used instead of the SOH.

In addition, in the above embodiments, the deterioration rate [%/Wh] indicated by the reduced amount of the SOH per unit cumulative charge amount [Wh] or unit cumulative discharge amount [Wh] is calculated, but the deterioration rate [%/unit time] indicated by the reduced amount of the SOH per unit time (example: one month or one year) may be calculated.

Further, regarding the performance deterioration of a lithium-ion battery, there are the type of battery having the performance that linearly deteriorates with respect to the usage mile and the usage time and the type of battery having the performance that linearly deteriorates with respect to $(kWh)^{(1/2)}$ and $(Year)^{(1/2)}$. For lithium-ion battery types that deteriorate according to the root rule, the deterioration rate may be calculated, for example, by dividing (the reduced amount of the SOH per unit cumulative charge amount [Wh] or unit cumulative discharge amount [Wh]) by (unit cumulative charge amount [Wh] or unit cumulative discharge amount $[Wh])^{(1/2)}$. The deterioration rate may be calculated by dividing (the reduced amount of the SOH per unit time) by (unit time)$^{(1/2)}$. In this manner, more probable results can be obtained.

Further, a plurality of modification examples described here may be combined.

In this specification, "acquisition" means that "the own device goes to fetch data stored in another device or a storage medium" based on a user input or the instruction of the program (active acquisition)". For example, the acquisition includes at least one of requesting or inquiring about other devices to receive a response, accessing and reading other devices or storage media, and the like, and "inputting data output from another device to the own device (passive acquisition)" based on a user input or an instruction of the program, for example, receiving data distributed (or transmitted, push notification, and the like), selecting and acquiring data or information from the received data or information, and "generating new data by editing data (text conversion, data sorting, partial data extraction, file format change, and the like) and acquiring the new data".

Although the present invention has been described above with reference to the embodiments (and examples), the present invention is not limited to the above embodiments (and examples). Various changes that can be understood by those skilled in the art can be made within the scope of the present invention in terms of the configuration and details of the present invention.

Some or all of the above embodiments may also be described, but are not limited to the following description.

1. A battery control system including:
a storage unit that stores a lower limit of an SOH secured on a target date in a plurality of battery systems, each including a PCS, a BMS, and a battery,
a deterioration rate calculation unit that calculates a deterioration rate indicated by a reduced amount of the SOH per unit cumulative charge amount [Wh] or unit cumulative discharge amount [Wh] for each battery system,
an SOH specifying unit that specifies the SOH at a reference timing in each of the battery systems,
a state calculation unit that calculates a cumulative charge amount or a cumulative discharge amount which is available from the reference timing to the target date under a condition that the SOH on the target date reaches the lower limit of the SOH, based on the target date, the lower limit of the SOH, the deterioration rate, and the SOH at the reference timing, for each battery system,
a priority determination unit that determines a priority of charging/discharging for the plurality of battery systems based on a calculation result obtained by the state calculation unit, and
a charging/discharging control unit that controls the charging/discharging of the plurality of battery systems based on the priority of the charging/discharging.

2. The battery control system described in 1, in which the storage unit stores the target date and the lower limit of the SOH for each battery system.

3. The battery control system described in 1 or 2, in which the state information calculation unit
calculates the cumulative charge amount or the cumulative discharge amount that is available within a predetermined target period, in a manner that the cumulative charge amount or the cumulative discharge amount that is available from the reference timing to the target date is proportionally divided at a ratio proportional to the number of days within the predetermined target period and the number of days from the reference timing to the target date, for each battery system, and
calculates a remaining cumulative charge amount or a remaining cumulative discharge amount that is available within the predetermined target period, in a manner that a cumulative charge amount or a cumulative discharge amount used within the predetermined target period is subtracted from the cumulative charge amount or the cumulative discharge amount that is available within the predetermined target period, for each battery system.

4. The battery control system described in 3, in which the priority determination unit determines the priority of the charging/discharging based on the remaining cumulative charge amount or cumulative discharge amount that is available within the predetermined target period.

5. The battery control system described in any one of 1 to 4, in which
the deterioration rate calculation unit calculates the deterioration rate based on measured values of the SOH at a plurality of previous measurement timings and a measured value of the cumulative charge amount or the cumulative discharge amount.

6. The battery control system described in any one of 1 to 5, in which
the state calculation unit calculates a probability that the SOH is less than a manufacturer-guaranteed value on a manufacturer guarantee expiration date after the reference timing, based on the SOH at the reference timing and the deterioration rate.

7. The battery control system described in 6, in which the priority determination unit determines the priority of the charging/discharging for the plurality of battery systems based on the probability.

8. The battery control system described in 6 or 7, further including:
an output unit that outputs the probability.

9. A battery control method including:
by a computer,
storing a lower limit of an SOH secured on a target date in a plurality of battery systems, each including a PCS, a BMS, and a battery,
calculating a deterioration rate indicated by a reduced amount of the SOH per unit cumulative charge amount [Wh] or unit cumulative discharge amount [Wh] for each battery system,
specifying the SOH at a reference timing in each of the battery systems,
calculating a cumulative charge amount or a cumulative discharge amount which is available from the reference timing to the target date under a condition that the SOH on the target date reaches the lower limit of the SOH, based on the target date, the lower limit of the SOH, the deterioration rate, and the SOH at the reference timing, for each battery system,
determining a priority of charging/discharging for the plurality of battery systems based on a result of the calculation, and
controlling the charging/discharging of the plurality of battery systems based on the priority of the charging/discharging.

10. A program causing a computer to function as:
a storage unit that stores a lower limit of an SOH secured on a target date in a plurality of battery systems, each including a PCS, a BMS, and a battery,
a deterioration rate calculation unit that calculates a deterioration rate indicated by a reduced amount of the SOH per unit cumulative charge amount [Wh] or unit cumulative discharge amount [Wh] for each battery system,
an SOH specifying unit that specifies the SOH at a reference timing in each of the battery systems,
a state calculation unit that calculates a cumulative charge amount or a cumulative discharge amount which is available from the reference timing to the target date under a condition that the SOH on the target date reaches the lower limit of the SOH, based on the target date, the lower limit of the SOH, the deterioration rate, and the SOH at the reference timing, for each battery system,
a priority determination unit that determines a priority of charging/discharging for the plurality of battery systems based on a calculation result obtained by the state calculation unit, and
a charging/discharging control unit that controls the charging/discharging of the plurality of battery systems based on the priority of the charging/discharging.

The invention claimed is:

1. A battery control system comprising:
a storage unit that stores a lower limit of a state of health (SOH) secured on a target date in a plurality of battery systems, each including a power conditioning system (PCS), a battery management system (BMS), and a battery;
a deterioration rate calculation unit that calculates a deterioration rate indicated by a reduced amount of the SOH per unit cumulative charge amount [Wh] or unit cumulative discharge amount [Wh] for each battery system;
an SOH specifying unit that specifies the SOH at a reference timing in each of the battery systems;
a state calculation unit that calculates a cumulative charge amount or a cumulative discharge amount which is available from the reference timing to the target date under a condition that the SOH on the target date reaches the lower limit of the SOH, based on the target date, the lower limit of the SOH, the deterioration rate, and the SOH at the reference timing, for each battery system;
a priority determination unit that determines a priority of charging/discharging for the plurality of battery systems based on a calculation result obtained by the state calculation unit; and
a charging/discharging control unit that controls the charging/discharging of the plurality of battery systems based on the priority of the charging/discharging.

2. The battery control system according to claim 1, wherein
the storage unit stores the target date and the lower limit of the SOH for each battery system.

3. The battery control system according to claim 1, wherein
the state calculation unit
calculates a cumulative charge amount or a cumulative discharge amount that is available within a predetermined target period, in a manner that the cumulative charge amount or the cumulative discharge amount that is available from the reference timing to the target date is proportionally divided at a ratio proportional to the number of days within the predetermined target period and the number of days from the reference timing to the target date, for each battery system, and
calculates a remaining cumulative charge amount or a remaining cumulative discharge amount that is available within the predetermined target period, in a manner that a cumulative charge amount or a cumulative discharge amount used within the predetermined target period is subtracted from the cumulative charge amount or the cumulative discharge amount that is available within the predetermined target period, for each battery system.

4. The battery control system according to claim 3, wherein
the priority determination unit determines the priority of the charging/discharging based on the remaining cumulative charge amount or cumulative discharge amount that is available within the predetermined target period.

5. The battery control system according to claim 1, wherein
the deterioration rate calculation unit calculates the deterioration rate based on measured values of the SOH at a plurality of previous measurement timings and a measured value of the cumulative charge amount or the cumulative discharge amount.

6. The battery control system according to claim 1, wherein
the state calculation unit calculates a probability that the SOH is less than a manufacturer-guaranteed value on a manufacturer guarantee expiration date after the reference timing, based on the SOH at the reference timing and the deterioration rate.

7. The battery control system according to claim 6, wherein
the priority determination unit determines the priority of the charging/discharging for the plurality of battery systems based on the probability.

8. The battery control system according to claim 6 or 7, further comprising:
an output unit that outputs the probability.

9. A battery control method comprising:
by a computer,
storing a lower limit of an SOH secured on a target date in a plurality of battery systems, each including a PCS, a BMS, and a battery;

calculating a deterioration rate indicated by a reduced amount of the SOH per unit cumulative charge amount [Wh] or unit cumulative discharge amount [Wh] for each battery system;

specifying the SOH at a reference timing in each of the battery systems;

calculating a cumulative charge amount or a cumulative discharge amount that is available from the reference timing to the target date under a condition that the SOH on the target date reaches the lower limit of the SOH, based on the target date, the lower limit of the SOH, the deterioration rate, and the SOH at the reference timing, for each battery system;

determining a priority of charging/discharging for the plurality of battery systems based on a result of the calculation; and controlling the charging/discharging of the plurality of battery systems based on the priority of the charging/discharging.

10. A non-transitory storage medium storing a program causing a computer to function as:

a storage unit that stores a lower limit of an SOH secured on a target date in a plurality of battery systems, each including a PCS, a BMS, and a battery;

a deterioration rate calculation unit that calculates a deterioration rate indicated by a reduced amount of the SOH per unit cumulative charge amount [Wh] or unit cumulative discharge amount [Wh] for each battery system;

an SOH specifying unit that specifies the SOH at a reference timing in each of the battery systems;

a state calculation unit that calculates a cumulative charge amount or a cumulative discharge amount which is available from the reference timing to the target date under a condition that the SOH on the target date reaches the lower limit of the SOH, based on the target date, the lower limit of the SOH, the deterioration rate, and the SOH at the reference timing, for each battery system;

a priority determination unit that determines a priority of charging/discharging for the plurality of battery systems based on a calculation result obtained by the state calculation unit; and a charging/discharging control unit that controls the charging/discharging of the plurality of battery systems based on the priority of the charging/discharging.

* * * * *